United States Patent
Sugimura et al.

(10) Patent No.: US 12,014,335 B2
(45) Date of Patent: Jun. 18, 2024

(54) MAINTENANCE APPARATUS, MAINTENANCE METHOD, AND RECORDING MEDIUM HAVING RECORDED THEREON MAINTENANCE PROGRAM

(71) Applicant: ADVANTEST CORPORATION, Tokyo (JP)

(72) Inventors: Hajime Sugimura, Saitama (JP); Yuji Sakai, Tokyo (JP)

(73) Assignee: ADVANTEST CORPORATION, Tokyo (JP)

( * ) Notice: Subject to any disclaimer, the term of this patent is extended or adjusted under 35 U.S.C. 154(b) by 171 days.

(21) Appl. No.: 17/686,443

(22) Filed: Mar. 4, 2022

(65) Prior Publication Data

US 2022/0188776 A1   Jun. 16, 2022

Related U.S. Application Data

(63) Continuation of application No. PCT/JP2020/036748, filed on Sep. 28, 2020.

(30) Foreign Application Priority Data

Sep. 30, 2019   (JP) ................ 2019-178444

(51) Int. Cl.
*G01R 3/00*   (2006.01)
*G01R 31/00*   (2006.01)
(Continued)

(52) U.S. Cl.
CPC ............. *G06Q 10/20* (2013.01); *G01R 3/00* (2013.01); *G01R 31/001* (2013.01); *G01R 31/26* (2013.01);
(Continued)

(58) Field of Classification Search
CPC ........ G01R 3/00; G01R 31/001; G01R 31/26; G01R 31/2601; G01R 31/28; G01R 31/2886; G01R 31/2893; G01R 35/00
See application file for complete search history.

(56) References Cited

U.S. PATENT DOCUMENTS 6,457,232 B1 * 10/2002 Isogai ................ H05K 13/0812
33/645
6,594,599 B1 * 7/2003 Kent ................ G01R 31/31728
702/84

(Continued)

FOREIGN PATENT DOCUMENTS

CN   105431745 A   3/2016
JP   2000114130 A   4/2000
(Continued)

OTHER PUBLICATIONS

Office Action issued for counterpart Japanese Application No. 2021-551274, issued by the Japanese Patent Office dated Oct. 18, 2022 (drafted on Oct. 4, 2022).
(Continued)

*Primary Examiner* — Dominic E Hawkins

(57) ABSTRACT

There is provided a maintenance apparatus including: an acquisition unit configured to acquire a plurality of test results, for each of a plurality of jigs, in a case where a plurality of devices under measurement, which are different from each other, are sequentially tested via the plurality of jigs; a calculation unit configured to calculate a variation in test results, for each jig, by using the plurality of test results; and a determination unit configured to determine maintenance timing of the jig based on the variation in the test results.

18 Claims, 7 Drawing Sheets

(51) Int. Cl.
*G01R 31/26* (2020.01)
*G01R 31/28* (2006.01)
*G01R 35/00* (2006.01)
*G06Q 10/20* (2023.01)

(52) U.S. Cl.
CPC ......... *G01R 31/2601* (2013.01); *G01R 31/28* (2013.01); *G01R 31/2886* (2013.01); *G01R 31/2893* (2013.01); *G01R 35/00* (2013.01)

(56) References Cited

U.S. PATENT DOCUMENTS

| | | | |
|---|---|---|---|
| 2002/0188367 A1 | 12/2002 | Hayashi | |
| 2005/0116734 A1* | 6/2005 | Savagaonkar | G01R 31/2886 324/754.03 |
| 2007/0084035 A1* | 4/2007 | Mori | G01R 35/005 29/407.01 |
| 2007/0222455 A1* | 9/2007 | Haruta | G01R 27/28 324/534 |
| 2009/0261504 A1* | 10/2009 | Uchida | G11B 5/855 264/293 |
| 2010/0166291 A1* | 7/2010 | Lee | G05B 19/402 702/85 |
| 2010/0237893 A1* | 9/2010 | Kobayashi | G01R 35/00 324/762.01 |
| 2011/0148446 A1 | 6/2011 | Suto | |
| 2011/0212551 A1 | 9/2011 | Maruyama | |
| 2013/0300429 A1 | 11/2013 | Jefferies | |
| 2015/0013722 A1* | 1/2015 | Amano | H01L 21/67051 134/57 R |
| 2015/0115974 A1* | 4/2015 | Yamashita | G01R 31/66 324/538 |
| 2017/0297160 A1* | 10/2017 | Matsushita | B23Q 17/2233 |
| 2019/0072945 A1* | 3/2019 | Matsuyama | G06N 20/00 |
| 2019/0391038 A1 | 12/2019 | Kitai | |
| 2020/0018779 A1* | 1/2020 | Kato | G01R 31/70 |

FOREIGN PATENT DOCUMENTS

| | | |
|---|---|---|
| JP | 2001326258 A | 11/2001 |
| JP | 2003098226 A | 4/2003 |
| JP | 2003282654 A | 10/2003 |
| JP | 2005175154 A | 6/2005 |
| JP | 2006105924 A | 4/2006 |
| JP | 2007248200 A | 9/2007 |
| JP | 2011179842 A | 9/2011 |
| JP | 2011258651 A | 12/2011 |
| WO | 2007105387 A1 | 9/2007 |
| WO | 2018139144 A1 | 8/2018 |

OTHER PUBLICATIONS (ISA/237) Written Opinion of the International Search Authority for International Patent Application No. PCT/JP2020/023294, issued/mailed by the Japan Patent Office dated Sep. 8, 2020.

(ISA/237) Written Opinion of the International Search Authority for International Patent Application No. PCT/JP2020/036748, issued/mailed by the Japan Patent Office dated Dec. 8, 2020.

Office Action issued for counterpart Taiwanese Application 109133635, transmitted from the Taiwan Intellectual Property Office on Dec. 12, 2023(issued on Dec. 7, 2023).

* cited by examiner

MAINTENANCE APPARATUS, MAINTENANCE METHOD, AND RECORDING MEDIUM HAVING RECORDED THEREON MAINTENANCE PROGRAM

The contents of the following Japanese patent application(s) are incorporated herein by reference:
NO. 2019-178444 filed in JP on Sep. 30, 2019
NO. PCT/JP2020/036748 filed in WO on Sep. 28, 2020

BACKGROUND

1. Technical Field

The present invention relates to a maintenance apparatus, a maintenance method, and a recording medium having recorded thereon a maintenance program.

2. Related Art

In a case where a device under measurement is tested via a jig, a state of the jig deteriorates as the test is repeated. Therefore, in the related art, the jig is regularly maintained at predetermined timing.

Technical Problem

However, regular maintenance of the jig may be excessive or inadequate in testing the device under measurement. Accordingly, in testing the device under measurement via the jig, it is desirable to optimize timing for maintaining the jig.

General Disclosure

In order to solve the above problem, a first aspect of the present invention provides a maintenance apparatus. The maintenance apparatus may include an acquisition unit configured to acquire a plurality of test results, for each of a plurality of jigs, in a case where a plurality of devices under measurement, which are different from each other, are sequentially tested via the plurality of jigs. The maintenance apparatus may include a calculation unit configured to calculate a variation in test results, for each jig, by using the plurality of test results. The maintenance apparatus may include a determination unit configured to determine maintenance timing of the jig based on the variation in the test results.

The determination unit may compare the variation in the test results with a variation in a normal state to calculate a difference, and determine the maintenance timing based on the difference.

The variation in the normal state may be an average of variations in the test results for the plurality of jigs in the normal state.

The determination unit may determine to maintain the jig when the difference exceeds a predetermined threshold value.

The predetermined threshold value may be determined by machine learning.

The determination unit may calculate the difference by machine learning.

The difference may be a Mahalanobis distance.

The maintenance apparatus may further include a learning unit configured to learn a covariance matrix, which is used for calculating the Mahalanobis distance, by using the plurality of test results acquired in the normal state.

The maintenance apparatus may further include a model generation unit configured to generate, by machine learning, a model for detecting a deviation with respect to the variation in the normal state based on the variation in the test results, in which the determination unit may calculate the difference based on an output of the model.

The calculation unit may analyze the plurality of test results in a predetermined period, while sequentially changing a start point of the period, and calculate the variation in the test results.

The calculation unit may calculate a variation in failure rate in the plurality of test results.

The failure rate may be a total failure rate indicating that at least one item in a plurality of test items has failed.

The failure rate may be a partial failure rate indicating that a specific item in a plurality of test items has failed.

The determination unit may be configured to determine a cleaning time of the jig as the maintenance timing.

The determination unit may further determine a cleaning method for the jig.

The determination unit may determine the cleaning method for the jig based on the variation in the test results for each item in a plurality of test items.

A second aspect of the present invention provides a maintenance method. The maintenance method may include acquiring a plurality of test results, for each of a plurality of jigs, in a case where a plurality of devices under measurement, which are different from each other, are sequentially tested via the plurality of jigs. The maintenance method may include calculating a variation in test results, for each jig, by using the plurality of test results. The maintenance method may include determining maintenance timing of the jig based on the variation in the test results.

A third aspect of the present invention provides a recording medium having recorded thereon a maintenance program. The maintenance program may be executed by a computer. The maintenance program may cause the computer to function as an acquisition unit configured to acquire a plurality of test results, for each of a plurality of jigs, in a case where a plurality of devices under measurement, which are different from each other, are sequentially tested via the plurality of jigs. The maintenance program may cause the computer to function as a calculation unit configured to calculate a variation in test results, for each jig, by using the plurality of test results. The maintenance program may cause the computer to function as a determination unit configured to determine maintenance timing of the jig based on the variation in the test results.

The summary clause does not necessarily describe all necessary features of the embodiments of the present invention. Further, the present invention may also be a subcombination of the features described above.

DESCRIPTION OF EXEMPLARY EMBODIMENTS

Hereinafter, the invention will be described through embodiments of the invention, but the following embodiments do not limit the invention according to claims. Further, not all of the combinations of features described in the embodiments are essential for means to solve the problem in the invention.

Figure 1:
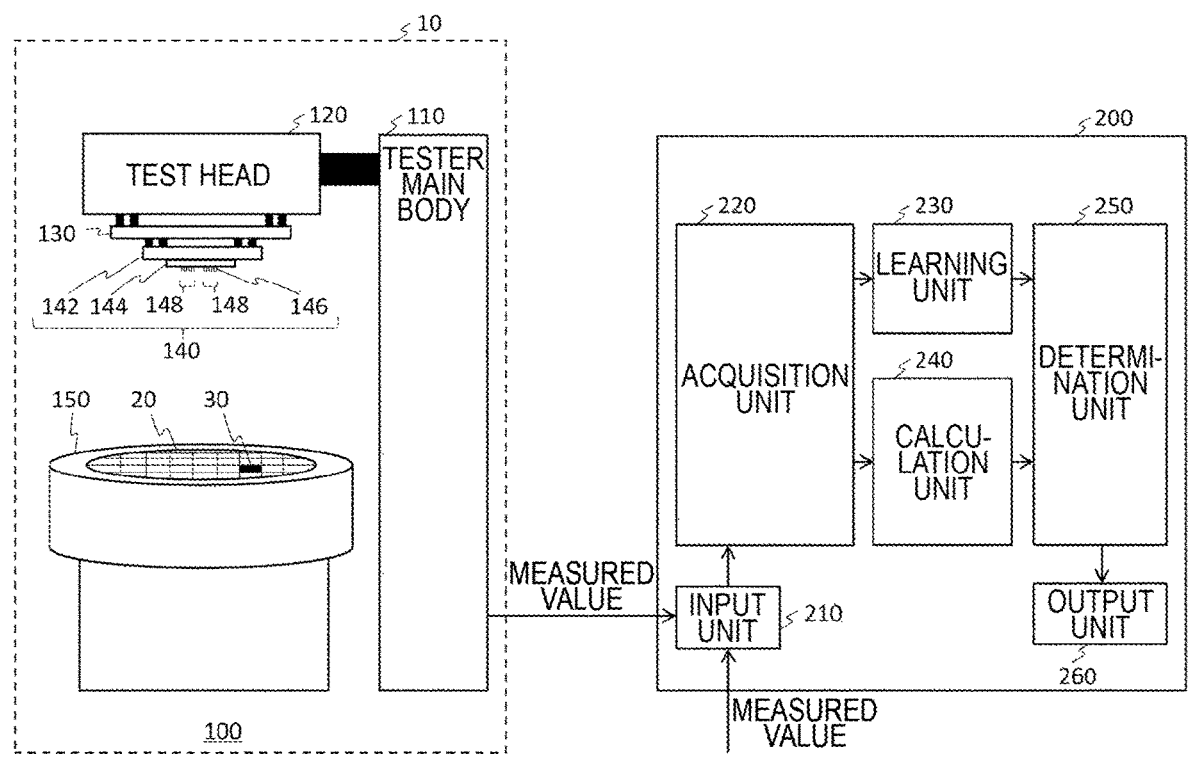
FIG. 1 shows a maintenance apparatus 200 according to the present embodiment together with a measurement system 10.

FIG. 1 shows a maintenance apparatus 200 according to the present embodiment together with a measurement system 10. The maintenance apparatus 200 according to the present embodiment may be, for example, applied to various tests that are carried out in the measurement system 10, such as tests that are carried out on a wafer in which a plurality of electronic devices such as semiconductors and Micro Electro Mechanical Systems (MEMS) are formed, tests that are carried out simultaneously on a plurality of bare chips obtained by dicing and singulating the wafer, or tests that are carried out simultaneously on a plurality of packages in which chips are sealed. That is, the maintenance apparatus 200 may also be applied to a test which is carried out in either a so-called pre-process or a post-process.

The present drawing shows, as an example, a case where the maintenance apparatus 200 is applied to a wafer test in which a wafer, on which a plurality of devices under measurement 30 (for example, chips) are formed as a measurement target 20, is tested by using a tester, and this case will be described below.

In the measurement system 10, a test apparatus 100 tests the measurement target 20. The test apparatus 100 may be, for example, a device test apparatus such as a system LSI tester, an analog tester, a logic tester, or a memory tester. The test apparatus 100 gives various test signals to the measurement target 20 via a jig, and acquires a response signal from the measurement target 20.

The test apparatus 100 includes a tester main body 110, a test head 120, a performance board 130, a probe card 140, and a prober 150.

The tester main body 110 is a main body unit of the test apparatus 100 and controls various tests. The tester main body 110 may have a function of outputting test results obtained by the various tests to the maintenance apparatus 200 according to the present embodiment via a wired or wireless manner.

The test head 120 is connected to the tester main body 110 via a cable, and is configured to be drivable between a test position for testing the measurement target 20, and a retreat position. When the test is performed, based on a control by the tester main body 110, the test head 120 transmits a test signal to the measurement target 20 at the test position, receives a response signal from the measurement target 20, and relays the received response signal to the tester main body 110.

The performance board 130 is detachably attached to the test head 120, and is electrically connected to the test head 120.

The probe card 140 is detachably attached to the performance board 130, and is electrically connected to the performance board 130. The probe card 140 has a substrate 142, a probe housing 144, and a plurality of probe needles 146, and brings the plurality of probe needles 146 into contact with a plurality of electrode pads in the measurement target 20 to make an electrical contact. That is, the probe card 140 functions as an interface unit connecting a test function of the test apparatus 100 and the measurement target 20 when the test apparatus 100 tests the measurement target 20. For example, the probe card 140 may be one using a probe needle of a vertical probe type, or may be one using a probe needle of a cantilever type. In addition, a configuration of the probe card 140 may be appropriately changed according to a type of the measurement target 20. For example, when the maintenance apparatus 200 intends to perform the test in the post-process, the probe card 140 may have a socket or the like. The details of the probe card 140 will be described below.

The substrate 142 may be, for example, a printed circuit board or the like. The probe housing 144 is provided on one surface of the substrate 142. In addition, on the other surface of the substrate 142, a plurality of connection pads (not shown) for connecting to the performance board 130 are provided.

The probe housing 144 holds the plurality of probe needles 146 inside such that each needle tip is exposed.

Each of the plurality of probe needles 146 has one end exposed to an outside of the probe housing 144, and has the other end electrically connected to a connection pad provided on the other surface of the substrate 142 via insides of the probe housing 144 and the substrate 142.

The plurality of probe needles 146 are arranged to respectively correspond to the plurality of electrode pads in some of the devices under measurement 30 (four in the present embodiment) among the plurality of devices under measurement 30 formed in the measurement target 20. Here, a group of probe needles 146, which correspond to each of the plurality of electrode pads in one device under measurement 30, forms one probe unit. In the present embodiment, a jig 148 may be such a probe unit as an example. Accordingly, the probe card 140 may have a plurality of jigs 148 corresponding to some of the devices under measurement 30 among the plurality of devices under measurement 30. In this way, the plurality of jigs 148 may respectively be constituted for areas which are provided on one component (for example, one probe card 140) and are functionally divided. Instead of this, the plurality of jigs 148 may respectively be constituted by components which are independent of each other.

The prober 150 conveys the measurement target 20 and places the measurement target 20 on a stage, and aligns the measurement target 20 with the probe card 140. In addition, the prober 150 has a cleaning unit (not shown) for cleaning the plurality of probe needles 146 in the jig 148. When an electrical connection with the device under measurement 30 is made via the jig 148, the test apparatus 100 performs a touchdown and a contact for the probe needle 146 to scratch a surface of the electrode pad in the device under measurement 30, that is, to be overdriven. At this time, an oxide, debris, or the like on the electrode pad is attached to the needle tip of the probe needle 146. In this way, attached substances are deposited on the needle tip of the probe needle 146 each time the touchdown is performed, and a contact resistance increases, and thus it becomes gradually impossible for the test apparatus 100 to perform an accurate test. Therefore, by providing the prober 150 with the cleaning unit and performing, for example, the touchdown of the needle tip of the probe needle 146 to be overdriven on the cleaning unit, so as to polish the tip thereof, the test apparatus 100 cleans the probe needle 146 to remove the attached substances which are deposited on the needle tip.

The maintenance apparatus 200 acquires and analyzes a plurality of test results in a case where the test apparatus 100 sequentially tests the plurality of devices under measurement 30, which are different from each other, via the plurality of jigs 148 in the measurement system 10. Further, the test apparatus 100 determines maintenance timing of the jig 148 by using analyzed information. The maintenance apparatus 200 may be a computer such as a PC (a personal computer), a tablet type computer, a smartphone, a workstation, a server computer, or a general-purpose computer, or may be a computer system in which a plurality of computers are connected. Such a computer system is also a computer in a broad sense. In addition, the maintenance apparatus 200 may be implemented by one or more virtual computer environments that can be run in the computer. Instead of this, the maintenance apparatus 200 may be a dedicated computer provided to maintain the jig 148, or may be dedicated hardware realized by dedicated circuitry. As an example, the maintenance apparatus 200 may be a Web server that is connected to the Internet, and in this case, a user can access, from various environments that can be connected to the Internet, the maintenance apparatus 200 on the cloud to receive various services that are provided. In addition, the maintenance apparatus 200 may be configured as a single apparatus that is connected to the measurement system 10 directly or via the network such as a Local Area Network (LAN), or may be configured integrally with the measurement system 10 to be realized as a part of a functional block of the measurement system 10. In addition, for example, when the plurality of test results are available from a direct input by a user or a storage medium such as a USB memory, the maintenance apparatus 200 may not be connected to the measurement system 10, or may be configured as an apparatus independent of the measurement system 10.

The maintenance apparatus 200 includes an input unit 210, an acquisition unit 220, a learning unit 230, a calculation unit 240, a determination unit 250, and an output unit 260. It should be noted that these blocks indicate functional blocks, and may not necessarily match an actual device configuration. That is, even when the configuration is shown as one block, the configuration may not be made by one device alone. In addition, even when the configuration is shown as respective blocks, the configuration may not be made by different devices, respectively.

The input unit 210 is an interface unit for inputting the plurality of test results. The input unit 210 is, for example, connected to the tester main body 110 of the test apparatus 100 directly or via the network, and receives inputs of the plurality of test results obtained by testing of the test apparatus 100. In addition, the input unit 210 may be a user interface that receives the input directly from the user via a keyboard, a mouse, or the like, or may be a device interface for connecting a USB memory, a disk drive, or the like to the maintenance apparatus 200, and may receive, via these interfaces, the inputs of the plurality of test results obtained by testing of the test apparatus 100.

The acquisition unit 220 is connected to the input unit 210, and acquires, for each jig 148, the plurality of test results in a case where the test apparatus 100 sequentially tests the plurality of devices under measurement 30, which are different from each other, via the plurality of jigs 148 in the measurement system 10. Further, the acquisition unit 220 supplies, to the learning unit 230, the plurality of test results acquired in a normal state. In addition, the acquisition unit 220 supplies, to the calculation unit 240, the plurality of test results acquired in an operating state. It should be noted that that the details of the test by the test apparatus 100 will be described below.

The learning unit 230 determines a variation in the normal state by using the plurality of test results acquired in the normal state. Here, the variation in the normal state may be an average of variations in the test results for the plurality of jigs 148 in the normal state. In addition, the learning unit 230 learns a covariance matrix which is used for calculating a Mahalanobis distance by using the plurality of test results acquired in the normal state. This will also be described below. The learning unit 230 supplies, to the determination unit 250, the variation in the normal state and the covariance matrix.

The calculation unit 240 calculates the variation in the test results for each jig 148 by using the plurality of test results acquired in the operating state. The calculation unit 240 supplies, to the determination unit 250, the variation in the test results for each jig 148.

The determination unit 250 determines the maintenance timing of the jig 148 based on the variation in the test results for each jig 148. At this time, the determination unit 250 may compare the variation in the test results with the variation in the normal state to calculate a difference, and determine the maintenance timing of the jig 148 based on the difference. The determination unit 250 supplies the maintenance timing of the jig 148 to the output unit 260.

The output unit 260 outputs the maintenance timing of the jig 148 determined by the determination unit 250. At this time, the output unit 260 may output the maintenance timing by a display on a monitor or the like, may output the maintenance timing by a voice from a speaker or the like, or may output the maintenance timing by data to various memory devices or the like.

Figure 2:
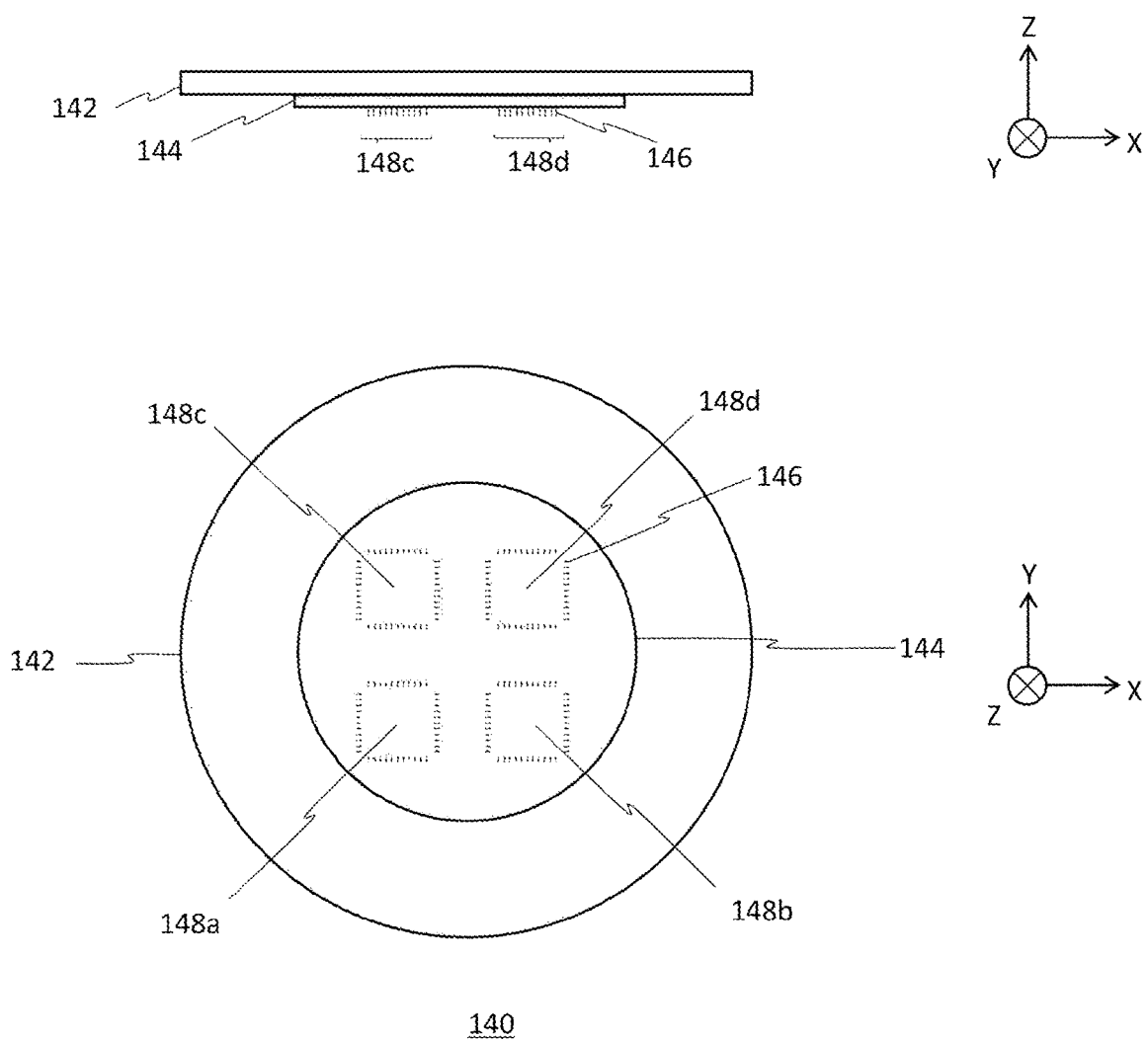
FIG. 2 shows an example of details of a probe card 140 according to the present embodiment.

FIG. 2 shows an example of details of a probe card 140 according to the present embodiment. A side view of the probe card 140 is shown in an upper part of the present drawing. In addition, a rear view of the probe card 140 is shown in a lower part of the present drawing. The plurality of probe needles 146 are arranged to respectively correspond to the plurality of electrode pads in some of the devices under measurement 30 among the plurality of devices under measurement 30 formed in the measurement target 20. Further, the plurality of probe needles 146, which respectively correspond to the plurality of electrode pads in one device under measurement 30, form a group (the probe unit) in a substantially square shape or a rectangular shape, for example, to form one jig 148. As an example, the present drawing shows a case where the probe card 140 has four jigs 148a to 148d arranged in a square shape, which are two in the X direction and two in the Y direction. This makes it possible for the test apparatus 100 to simultaneously test (a simultaneous test) some (four in the present embodiment) of the devices under measurement 30 by bringing the probe card 140 into contact with the measurement target 20. It should be noted that the number and an arrangement of the jigs 148 included in the probe card 140 are not limited to this. The probe card 140 may have jigs 148 of more or less than four. In addition, the probe card 140 may have, for example, the plurality of jigs 148 arranged in a shape different from a square, such as a straight line.

Figure 3:
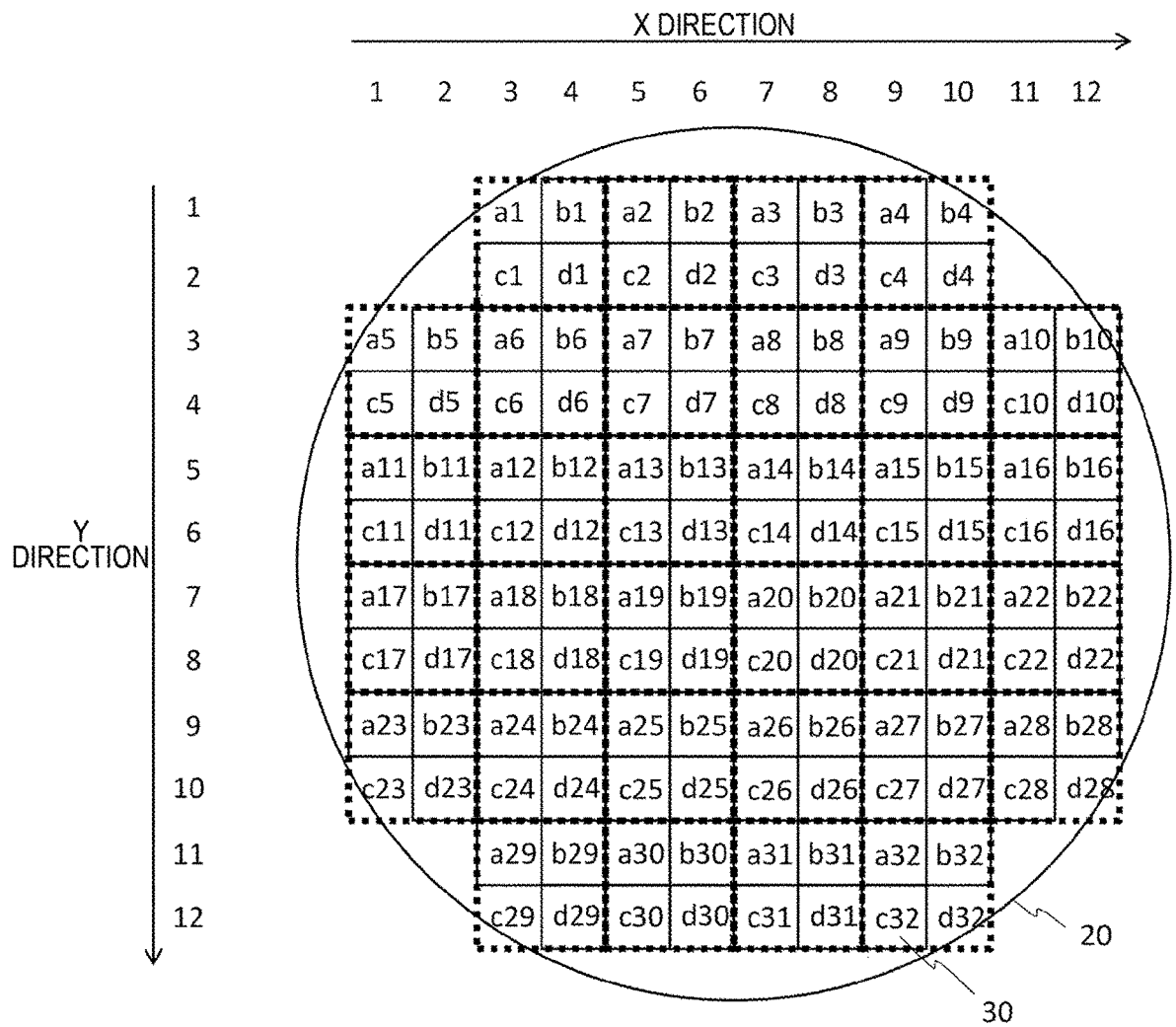
FIG. 3 shows an example of a case where the probe card 140 according to the present embodiment is brought into contact with a measurement target 20.

FIG. 3 shows an example of a case where the probe card 140 according to the present embodiment is brought into contact with a measurement target 20. As shown in the present drawing, the plurality of devices under measurement 30 are formed on the measurement target 20. Here, in a case where the unique device under measurement 30 is separately described, a coordinate x in the X direction and a coordinate y in the Y direction are used to indicate the device under measurement 30 (x, y).

The test apparatus 100 simultaneously tests up to four devices under measurement 30 by using, for example, the probe card 140 shown in FIG. 2. That is, the test apparatus 100 aligns the probe card 140 and the measurement target 20 by the prober 150, and performs the touchdown of the probe card 140 on the measurement target 20 (first time). Further, the test apparatus 100 simultaneously tests the device under measurement 30 (3, 1) via the jig 148a, the device under measurement 30 (4, 1) via the jig 148b, the device under measurement 30 (3, 2) via the jig 148c, and the device under measurement 30 (4, 2) via the jig 148d. In this way, the test apparatus 100 acquires a test result a1 of the device under measurement 30 (3,1), a test result b1 of the device under measurement 30 (4,1), and a test result c1 of the device under measurement 30 (3,2), and a test result d1 of the device under measurement 30 (4, 2). However, the device under measurement 30 (3, 1) is not actually formed on the measurement target 20. Accordingly, for the test result a1 of the device under measurement 30 (3, 1), the test apparatus 100 acquires the test result as no result. In this way, for the test result in a region where the device under measurement 30 does not exist, the test apparatus 100 may acquire the test result as no result.

Next, the test apparatus 100 changes relative positions of the probe card 140 and the measurement target 20 by the prober 150, and performs the touchdown of the probe card 140 on the measurement target 20 again (second time). Further, the test apparatus 100 simultaneously tests the device under measurement 30 (5, 1) via the jig 148a, the device under measurement 30 (6, 1) via the jig 148b, the device under measurement 30 (5, 2) via the jig 148c, and the device under measurement 30 (6, 2) via the jig 148d. In this way, the test apparatus 100 acquires a test result a2 of the device under measurement 30 (5,1), a test result b2 of the device under measurement 30 (6,1), and a test result c2 of the device under measurement 30 (5,2), and a test result d2 of the device under measurement 30 (6, 2).

Similarly, the test apparatus 100 changes the relative positions of the probe card 140 and the measurement target 20 by the prober 150, and performs the touchdown of the probe card 140 on the measurement target 20 again (third time). Further, the test apparatus 100 simultaneously tests the device under measurement 30 (7, 1) via the jig 148a, the device under measurement 30 (8, 1) via the jig 148b, the device under measurement 30 (7, 2) via the jig 148c, and the device under measurement 30 (8, 2) via the jig 148d. In this way, the test apparatus 100 acquires a test result a3 of the device under measurement 30 (7,1), a test result b3 of the device under measurement 30 (8,1), and a test result c3 of the device under measurement 30 (7,2), and a test result d3 of the device under measurement 30 (8, 2).

The test apparatus 100 sequentially tests the plurality of devices under measurement 30, which are different from each other, via the plurality of jigs 148 by repeating such an alignment and a touchdown multiple times. Further, the test apparatus 100 acquires the plurality of test results obtained by testing the plurality of devices under measurement 30, and stores the test results in association with information indicating the jigs via which the plurality of test results were tested, respectively. The test apparatus 100 may output the plurality of test results stored in this way to the maintenance apparatus 200 via a wired or wireless manner. The maintenance apparatus 200 according to the present embodiment analyzes the plurality of test results acquired in this way to determine the maintenance timing of the jig 148.

Figure 4:
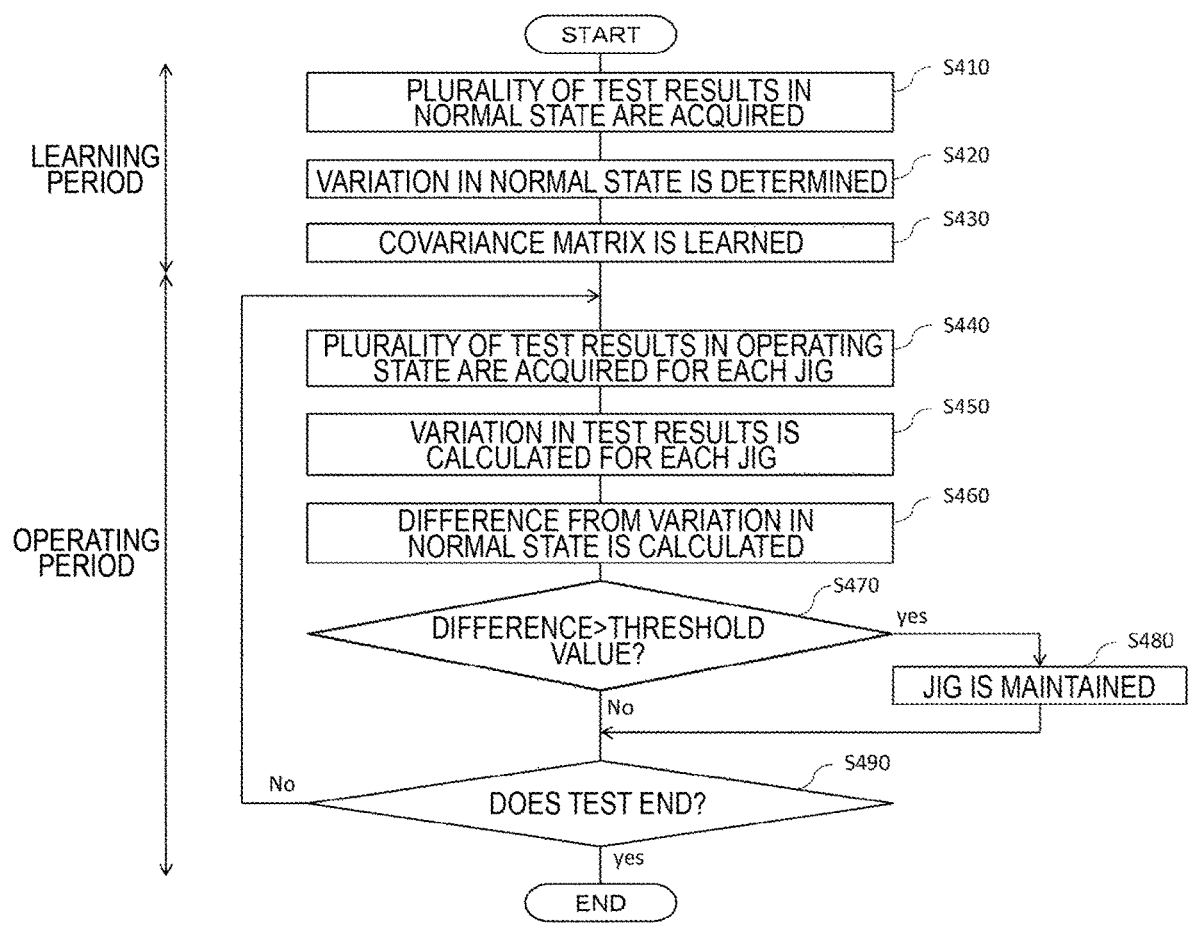
FIG. 4 shows an example of a flow in which the maintenance apparatus 200 according to the present embodiment determines maintenance timing of a jig 148.

FIG. 4 shows an example of a flow in which the maintenance apparatus 200 according to the present embodiment determines maintenance timing of a jig 148. The maintenance apparatus 200 acquires the plurality of test results in the normal state in step 410. Here, the plurality of test results in the normal state may be, for example, the plurality of test results obtained by sequentially testing the plurality of devices under measurement 30, which are different from each other, via the plurality of normal jigs 148. As an example, the test apparatus 100 uses the probe card 140 that is cleaned or is unused, and acquires the plurality of test results obtained by sequentially testing all the devices under measurement 30 formed on one measurement target 20 (for example, one wafer), via the plurality of jigs 148 in the probe card 140. Here, the one measurement target 20 may be, for example, an initial (a first) wafer or the like when mass production of a new type of wafer is started. It should be noted that in acquiring the plurality of test results in the normal state, the test apparatus 100 may clean the probe card 140 again in the middle of the test of the one measurement target 20. The input unit 210 receives the input of the plurality of test results in the normal state acquired in this way, and supplies the input to the acquisition unit 220.

That is, the acquisition unit 220 respectively acquire a plurality of test results a1 to a32 obtained by the sequential test via the normal jig 148a (cleaned or unused), a plurality of test results b1 to b32 obtained by the sequential test via the normal jig 148b, a plurality of test results c1 to c32 obtained by the sequential test via the normal jig 148c, and a plurality of test results d1 to d32 obtained by the sequential test via the normal jig 148d.

It should be noted that here, as an example, each of the plurality of test results may indicate any of cases over whether the test carried out on the device under measurement 30 has passed, has failed, or has no test result. Typically, the test apparatus 100 tests each of the devices under measurement 30 for a plurality of test items corresponding to a plurality of categories such as an open short test, a DC test, a function test, an FM test, and a USB test. Accordingly, for example, the plurality of test results may respectively indicate any of cases over whether all of the plurality of test items, of which the tests are respectively carried out for the devices under measurement 30, have passed (P: a total pass), at least one item has failed (F: a total failure), or there is no test result (N/A).

As an example, as the plurality of test results obtained by the test via the normal jig 148a, the acquisition unit 220 acquires the test results of a1=N/A, a2=P, a3=P, a4=F, a5=N/A, a6=P, a32=P. Similarly, the acquisition unit 220 respectively acquire the plurality of test results b1 to b32 obtained by the test via the normal jig 148b, the plurality of test results c1 to c32 obtained by the test via the normal jig 148c, and the plurality of test results d1 to d32 obtained by the test via the normal jig 148d. The acquisition unit 220 supplies, to the learning unit 230, the plurality of test results in the normal state.

In step 420, the test apparatus 100 determines the variation in the normal state. Here, the variation in the normal state may be an average of variations in the test results for the plurality of jigs 148 in the normal state. For example, among the plurality of test results acquired in the normal state, the learning unit 230 analyzes the plurality of test results in a predetermined period, while sequentially changing a start point of the period, thereby determining the variation in the normal state. As an example, as the plurality of test results in the predetermined period, the learning unit 230 uses the plurality of test results in 20 touchdown periods. In that case, at a start point position m=1, the learning unit 230 calculates, for example, an average total failure rate in the plurality of test results a1 to a20, b1 to b20, c1 to c20, and d1 to d20 obtained by a first touchdown to a 20th touchdown. That is, the learning unit 230 calculates a total failure rate u1 indicating how many times total failures have occurred among the plurality of test results a1 to a20, b1 to b20, c1 to c20, and d1 to d20 (excluding no test result should be noted).

The learning unit 230 repeats the calculation while sequentially changing the start point of the period. That is, next, at a start point position m=2, the learning unit 230 calculates a total failure rate u2 in the plurality of test results a2 to a21, b2 to b21, c2 to c21, and d2 to d21 obtained by a second touchdown to a 21st touchdown, by a method similar to that as described above. Similarly, at a start point position m=3, the learning unit 230 calculates a total failure rate u3 in the plurality of test results a3 to a22, b3 to b22, c3 to c22, and d3 to d22 obtained by a third touchdown to a 22nd touchdown. In this way, the learning unit 230 determines, for example, a variation u (u1, u2, u3, . . . , un) in the normal state by sequentially changing the start point of the period. The learning unit 230 supplies, to the determination unit 250, the determined variation u in the normal state.

In step 430, the maintenance apparatus 200 calculates the covariance matrix. For example, the learning unit 230 learns the covariance matrix which is used for calculating the Mahalanobis distance by using the plurality of test results acquired in the normal state. Generally, the Mahalanobis distance for a group of values represented by a multivariable vector x such that the mean vector is u and the covariance matrix is $\Sigma$ is defined as the following Expression. More specifically, the Mahalanobis distance quantitatively indicates how far certain data is away from the average, and indicates a distance from a data group in consideration of a degree of dispersion of the data in each direction. Accordingly, when the multivariable vector x matches the mean vector u, the Mahalanobis distance becomes 0, and when the multivariable vector x does not match the mean vector u, the Mahalanobis distance becomes larger than 0.

$$D_M(x) = \sqrt{(x-u)^T \Sigma^{-1}(x-u)} \quad \text{[Math 1]}$$

The learning unit 230 respectively calculates covariances which are average values of products of deviations from averages between respective variables, and learns the covariance matrix E which is a matrix in which the covariances are arranged. Further, the learning unit 230 supplies the learned covariance matrix E to the determination unit 250.

The maintenance apparatus 200 acquires, for each jig, the plurality of test results in the operating state in step 440. For example, the acquisition unit 220 acquires, for each jig 148, the plurality of test results in a case where the plurality of devices under measurement 30, which are different from each other, are sequentially tested via the plurality of jigs 148 in the operating state. That is, the acquisition unit 220 respectively acquire the plurality of test results a1 to a32 obtained by the sequential test via the jig 148a in the operating state, the plurality of test results b1 to b32 obtained by the sequential test via the jig 148b, the plurality of test results c1 to c32 obtained by the sequential test via the jig 148c, and the plurality of test results d1 to d32 obtained by the sequential test via the jig 148d. Here, similarly to the plurality of test results in the normal state, the plurality of test results may respectively indicate any of cases over whether all of the plurality of test items, of which the tests are respectively carried out for the devices under measurement 30, have passed (the total pass), at least one item has failed (the total failure), or there is no test result. The acquisition unit 220 sequentially acquires the plurality of test results in the operating state, and supplies the acquired plurality of test results to the calculation unit 240.

The maintenance apparatus 200 calculates, for each jig 148, the variation in the test results in the operating state in step 450. For example, the calculation unit 240 calculates, for each jig 148, the variation in the test results by using the plurality of test results acquired in the operating state. At this time, similarly to the learning unit 230, the calculation unit 240 may analyze the plurality of test results in a predetermined period, while sequentially changing a start point of the period, and calculate the variation in the test results. In this way, the maintenance apparatus 200 calculates the variation in the test results based on the test result in a certain period rather than an accumulation of the test results, and thus it is possible to calculate the variation in the test results with high sensitivity. In addition, at this time, the calculation unit 240 may calculate the variation in failure rate in the plurality of test results. Here, the failure rate may be a total failure rate indicating that at least one item in the plurality of test items has failed. In this way, the maintenance apparatus 200 calculates the variation in the test results by using a comparatively simple index of whether the total pass or the total failure has occurred in the test, and thus it is possible to reduce a calculation load for the variation in the test results.

As an example, as the plurality of test results in the predetermined period, the calculation unit 240 uses the plurality of test results in 20 touchdown periods. In that case, at the start point position m=1, the calculation unit 240 calculates the total failure rate in the plurality of test results a1 to a20 obtained by the first touchdown to the 20th touchdown via the jig 148a. For example, the calculation unit 240 calculates a total failure rate xa1 indicating how many times total failures have occurred among the plurality of test results a1 to a20 (excluding no test result should be noted).

The calculation unit 240 repeats the calculation while sequentially changing the start point of the period. That is, next, at the start point position m=2, the calculation unit 240 calculates a total failure rate xa2 in the plurality of test results a2 to a21 obtained by the second touchdown to the 21st touchdown via the jig 148a, by a method similar to that as described above. Similarly, at the start point position m=3, the calculation unit 240 calculates a total failure rate xa3 in the plurality of test results a3 to a22 obtained by the third touchdown to the 22nd touchdown via the jig 148a. In this way, the calculation unit 240 calculates a variation xa (xa1, xa2, xa3, . . . , xan) in the test results for the jig 148a by sequentially changing the start point of the period.

By a similar method, the calculation unit 240 respectively calculates a variation xb (xb1, xb2, xb3, . . . , xbn) in the test results for the jig 148b, a variation xc (xc1, xc2, xc3, . . . , xcn) in the test results for the jig 148c, and a variation xd (xd1, xd2, xd3, . . . , xdn) in the test results for the jig 148d. In this way, the calculation unit 240 calculates, for each jig 148, a variation x in the test results by using the plurality of test results in the operating state. The calculation unit 240 supplies, to the determination unit 250, the variation x (xa, xb, xc, xd) in the test results calculated for each jig 148.

In step 460, the maintenance apparatus 200 calculates the difference from the variation u in the normal state. For example, the determination unit 250 may compare the variation x in the test results for each jig 148 with the variation u in the normal state to calculate the difference, and determine the maintenance timing of the jig 148 based on the difference. Here, the difference may be the Mahalanobis distance.

That is, in (Math. 1), the determination unit 250 substitutes, as the multivariable vector x, the variation x (xa, xb, xc, xd) in the test results for each jig 148 calculated in step 450, and substitutes, as the mean vector u, the variation u (u1, u2, u3, . . . , un) in the normal state calculated in step 420, respectively, and calculates the Mahalanobis distance by using an inverse matrix of the covariance matrix $\Sigma$ learned in step 430.

In step 470, the maintenance apparatus 200 determines whether the difference calculated in step 460 exceeds a threshold value. For example, the determination unit 250 determines whether the Mahalanobis distance calculated in step 460 exceeds a predetermined threshold value. Further, when it is determined that the Mahalanobis distance does not exceed the threshold value, the determination unit 250 determines that it is not necessary to maintain the jig 148, and processing proceeds to step 490. On the other hand, when it is determined that the Mahalanobis distance exceeds the threshold value, the determination unit 250 determines that it is necessary to maintain the jig 148, and the processing proceeds to step 480. At this time, the determination unit 250 may determine that it is timing of maintaining the jig 148 when the Mahalanobis distance exceeds the threshold value a predetermined number of times. In this way, the determination unit 250 determines the maintenance timing of the jig 148 based on the variation x in the test results for each jig 148. Here, the determination unit 250 may determine a cleaning time of the jig 148 as the maintenance timing. However, the present invention is not limited to this. As the maintenance timing, for example, the determination unit 250 may determine a time for the maintenance, which is different from the cleaning time, such as a replacement timing of the jig 148.

In step 480, the maintenance apparatus 200 maintains the jig 148. As an example, the maintenance apparatus 200 may carry out cleaning of the jig 148 as the maintenance of the jig 148. The maintenance apparatus 200 maintains the jig 148, and then the processing proceeds to step 490.

In step 490, the maintenance apparatus 200 determines whether the test of the measurement target 20 ends. When it is determined that the test of the measurement target 20 ends, the maintenance apparatus 200 ends the processing. On the other hand, when it is determined that the test of the measurement target 20 does not end, the maintenance apparatus 200 returns the processing to step 440 and repeats the analysis, while sequentially changing the start point of the period.

Figure 5:
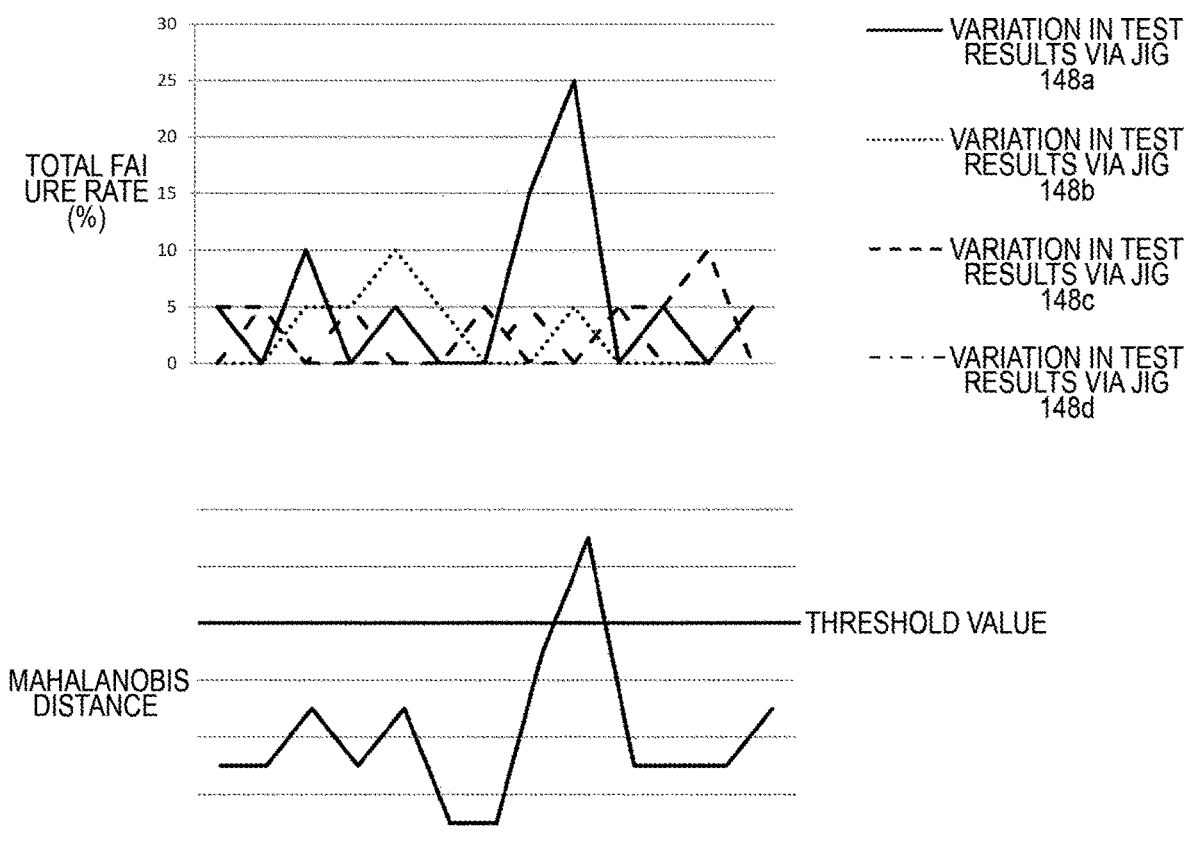
FIG. 5 shows a variation in test results and a Mahalanobis distance calculated for each jig 148 by the maintenance apparatus 200 according to the present embodiment.

FIG. 5 shows a variation in test results and a Mahalanobis distance calculated for each jig 148 by the maintenance apparatus 200 according to the present embodiment. In the present drawing, the horizontal axis indicates the start point position m. In addition, in an upper part of the present drawing, the vertical axis indicates the total failure rate [%]. Accordingly, the upper part of the present drawing shows the variation in the test results (the total failure rate) for each jig 148 when the start point position m is sequentially changed. In addition, in a lower part of the present drawing, the vertical axis indicates the Mahalanobis distance. Accordingly, the lower part of the present drawing shows the Mahalanobis distance calculated based on the variation in the test results for each jig when the start point position m is sequentially changed. As shown in the present drawing, the maintenance apparatus 200 according to the present embodiment calculates the variation in test results for each of the plurality of jigs 148. That is, when there are four jigs 148, the maintenance apparatus 200 calculates the variations in the four test results. However, the maintenance apparatus 200 calculates the Mahalanobis distance based on the variation in the test results for each of the plurality of jigs 148, and determines the maintenance timing of the jig 148 based on the Mahalanobis distance. In this way, the maintenance apparatus 200 determines the maintenance timing of the jig 148, for example, based on only one index such as the Mahalanobis distance, and thus it is possible to comparatively simply determine the maintenance timing of the jig 148.

Typically, a defect in the device under measurement 30 evenly occurs in the measurement target 20. In addition, the plurality of jigs 148 in the probe card 140 are suddenly soiled with a small probability. Accordingly, when the plurality of jigs 148 sequentially test the plurality of devices under measurement, which are different from each other, the probability that the plurality of test results fail at the same time is very small. The maintenance apparatus 200 according to the present embodiment uses such an actual situation, and determines the maintenance timing of the jig 148 based on the variation in the test results for each jig 148. Typically, the cleaning of the jig 148 is carried out by performing the touchdown of the jig on the file to be overdriven. At this time, the tips of the plurality of probe needles 146 in the jig 148 are gradually scraped. Accordingly, a lifetime of the probe card 140 is substantially determined by the number of times of performing the cleaning. For the test apparatus in the related art, the jig 148 is cleaned according to a predetermined cycle according to a rule of thumb, a preliminary test, or the like. However, regular maintenance of the jig 148 may be excessive or inadequate in testing the device under measurement 30. For example, when the maintenance of the jig 148 is excessive, the lifetime of the probe card 140 may be shortened more than necessary. In addition, when the maintenance of the jig 148 is inadequate, a yield decreases as the contact resistance of the probe needle 146 increases. In this way, there is a trade-off relationship between the lifetime and the yield of the probe card 140. In contrast to this, with the maintenance apparatus 200 according to the present embodiment, it is possible to determine the maintenance timing of the jig 148 on demand based on the variation in the test results for each jig 148, and thus it is possible to optimize the timing of maintaining the jig 148. In this way, with the maintenance apparatus 200 according to the present embodiment, it is possible to extend the lifetime of the probe card 140 while suppressing the decrease in yield.

It should be noted that that in the above description, only the case where the maintenance apparatus 200 determines the maintenance of the jig 148 on demand is shown, but the present invention is not limited to this. For example, the maintenance apparatus 200 may maintain the jig 148 on demand in addition to regularly maintaining the jig 148, as in the related art. That is, the maintenance apparatus 200 may maintain the jig 148 in a combination of the regular maintenance and the on-demand maintenance.

In addition, in the above description, the case, where the maintenance apparatus 200 determines the variation in the normal state and learns the covariance matrix based on the test result of the first wafer when mass production of a new type of wafer is started, is shown as an example. However, the present invention is not limited to this. For example, the maintenance apparatus 200 determines the variation in the normal state and learns the covariance matrix based on the test result of the first wafer in a learning period, and then in a case where the test result of the measurement target 20, which has a yield higher than that of the first wafer in the operating state, is obtained, the maintenance apparatus 200 may update the variation in the normal state and the covariance matrix based on the test result.

In addition, in the above description, the case, where, the maintenance apparatus 200 determines the variation in the normal state and learns the covariance matrix based on the test results of one measurement target 20 (one wafer), is shown as an example; however, the present invention is not limited to this. The maintenance apparatus 200 may determine the variation in the normal state and learn the covariance matrix based on statistics (for example, an average) of the test results of the plurality of measurement targets 20.

In addition, in the above description, the case, where the maintenance apparatus 200 learns the covariance matrix and uses the Mahalanobis distance as the difference between the variation in the test results for each jig 148 and the variation in the normal state, is shown as an example; however, the present invention is not limited to this. For example, the maintenance apparatus 200 may input, as training data, the plurality of test results in the normal state to a learning model such as a neural network, and determine the maintenance timing of the jig 148 based on a difference between the variation in the test results for each jig 148 and a variation in outputs of the learning model.

In addition, the maintenance apparatus 200 may use the Euclidean distance instead of the Mahalanobis distance as the difference. In this case, for example, by subtracting the variation u in the normal state from the variation x in the test results and taking an absolute value for each component, the determination unit 250 may calculate a sum of these as the difference.

Further, in the above description, the case, where the determination unit 250 uses the Mahalanobis distance as an example of calculating the difference by machine learning, is shown. However, the determination unit 250 may calculate the difference by another machine learning algorithm.

Figure 6:
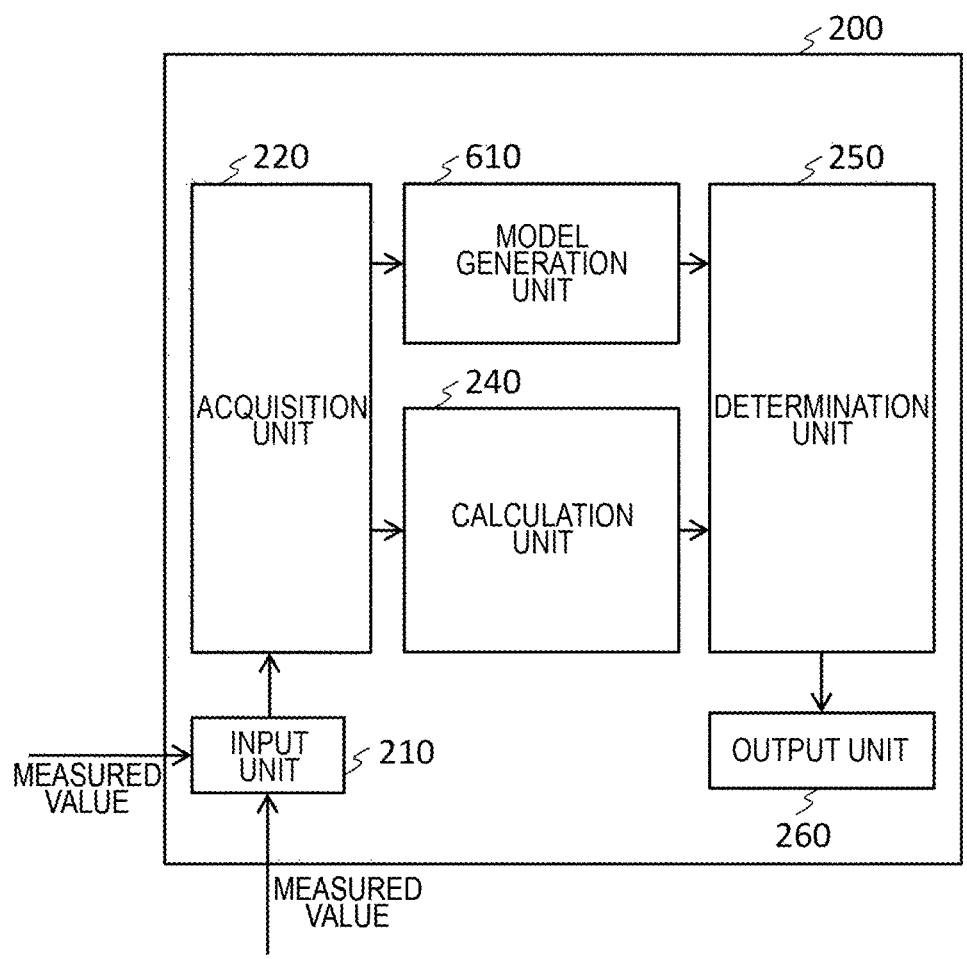
FIG. 6 shows the maintenance apparatus 200 according to a modification example of the present embodiment.

FIG. 6 shows the maintenance apparatus 200 according to a modification example of the present embodiment. In FIG. 6, the same signs and numerals are given to members having the same functions and configurations as those in FIG. 1, and the descriptions will be omitted except for the following differences. The maintenance apparatus 200 according to the present modification example includes a model generation unit 610 instead of the learning unit 230.

The model generation unit 610 generates, by machine learning, a model for detecting a deviation with respect to the variation u in the normal state based on the variation x in the test results. As an example, the model generation unit 610 may generate the model by an unsupervised anomaly detection (Unsupervised Anomaly Detection) algorithm. For example, the model generation unit 610 calculates a feature of a statistical distribution of the variation u in the normal state by setting, as learning data, the plurality of test results acquired in the learning period. Further, the model generation unit 610 generates the model to detect the deviation with respect to the change u in the normal state, when the variation x in the test results is input to the model, based on the feature of the calculated statistical distribution. In this way, the model generation unit 610 generates the model by unsupervised learning, and thus it is possible to omit work of an annotation for creating the training data, and it is possible to generate the model more easily. However, the present invention is not limited to this. The model generation unit 610 may generate the model by various learning algorithms such as a supervised learning algorithm, a semi-supervised learning algorithm, and a reinforcement learning algorithm. The model generation unit 610 supplies the generated model to the determination unit 250.

The determination unit 250 calculates the difference based on the output of the model supplied from the model generation unit 610. For example, the determination unit 250 inputs, to the model generated by the model generation unit 610, the variation x in the test results calculated for each jig 148 by the calculation unit 240, and calculates the output of the model as the difference.

In this way, the maintenance apparatus 200 according to the present modification example calculates the difference based on the output of the model generated by machine learning. In this way, with the maintenance apparatus 200 according to the present modification example, it is possible to realize the determination of the maintenance timing of the jig 148 by various machine learning algorithms.

In addition, as described above, the determination unit 250 determines to maintain the jig 148 when the calculated difference exceeds a predetermined threshold value. In this case, the predetermined threshold value may be a fixed value preset by a worker based on a rule of thumb, but is not limited to this. As an example, the predetermined threshold value may be determined by machine learning. For example, the maintenance apparatus 200 may learn the threshold value for determining the maintenance timing of the jig 148 by machine learning. In this case, the maintenance apparatus 200 acquires data of a maintenance result for the jig 148, for example, data indicating what type of cleaning was performed at what timing, or the like. Further, the maintenance apparatus 200 learns a relationship between the difference and the maintenance result by setting, as the learning data, the difference data calculated by the determination unit 250 and the result data. In this way, by machine learning, the maintenance apparatus 200 determines a degree of a value of the difference for carrying out the maintenance of the jig 148, that is, the threshold value for determining the maintenance timing. In this way, with the maintenance apparatus 200, the threshold value for determining the maintenance timing can be set to an optimal value based on the result rather than a human intervention.

In addition, in the above description, the case, where the failure rate used as the test result is the total failure rate indicating that at least one item (also referred to as a bin or a category) in the plurality of test items has failed, is shown as an example; however, the present invention is not limited to this. The failure rate may be a partial failure rate indicating that a specific item in the plurality of test items has failed. That is, the maintenance apparatus 200 may use, as the test result, the partial failure rate indicating that the specific item has failed regardless of whether another item in the plurality of test items has failed. Here, the number of such a specific item may be one or may be plural. When there are a plurality of specific items, the maintenance apparatus 200 may set, as the partial failure rate, a logical sum of the test results in the respective items. In this way, with the maintenance apparatus 200, it is possible to use, as the test result, any of the total failure rate and the partial failure rate, and it is possible to flexibly handle various cases.

Further, in the above description, the case, where the determination unit 250 determines the cleaning time of the jig 148 as the maintenance timing, is shown as an example. However, in addition to this, the determination unit 250 may further determine a cleaning method for the jig 148. For cleaning the jig 148, there are various types, for example, such as cleaning with a brush, cleaning with a polishing sheet, and cleaning with a cleaning wafer. In addition to the cleaning performed to be completed inside the apparatus as described above, there is also cleaning performed from the outside of the apparatus, such as cleaning performed, with the probe card being removed, by using another apparatus. The determination unit 250 may determine an optimal cleaning method from among such a plurality of types of cleaning.

At this time, the determination unit 250 may determine the cleaning method for the jig 148 based on the variation in the test results for each item in the plurality of test items. For example, when the difference in the variation in the failure rate in the open short test exceeds a predetermined threshold value, it is highly possible that a cause is dirt on the needle tip, and thus the determination unit 250 may determine to perform the cleaning by the polishing sheet. Similarly, when the variation in the failure rate in a leak test (a part of the DC test) exceeds a predetermined threshold value, it is highly possible that a cause is a short circuit between pins, and thus the determination unit 250 may determine to perform the cleaning by a brush. In this way, the maintenance apparatus 200 can determine the optimal cleaning method depending on which test item is a cause of the determination to clean the jig 148.

In addition, in the above description, the case, where in acquiring the plurality of test results in the normal state, the plurality of test results are acquired with an initial (a first) wafer as the measurement target when mass production of a new type of wafer is started, is shown as an example. However, qualities of the wafers themselves are also different from each other, and each wafer may have a unique characteristic. Such a unique characteristic is unlikely to vary widely within one lot; however, the variations may be significant between lots. Accordingly, each time the lot which is the measurement target is switched, the maintenance apparatus 200 may acquire, via the normal jig 148, the plurality of test results in the normal state with a leading wafer of the lot as the measurement target. That is, each time the lot is switched, the maintenance apparatus 200 may update the variation u in the normal state which is a reference of the difference. This makes it possible for the maintenance apparatus 200 to determine whether the cause of the large difference is on a jig 148 side or a wafer side.

Various embodiments of the present invention may be described with reference to flowcharts and block diagrams whose blocks may represent (1) steps of processes in which operations are executed or (2) sections of apparatuses responsible for executing operations. Certain steps and sections may be implemented by dedicated circuitry, programmable circuitry supplied with computer-readable instructions stored on computer-readable media, and/or processors supplied with computer-readable instructions stored on computer-readable media. Dedicated circuitry may include digital and/or analog hardware circuits, and may include integrated circuits (IC) and/or discrete circuits. Programmable circuitry may include reconfigurable hardware circuits comprising logical AND, OR, XOR, NAND, NOR, and other logical operations, flip-flops, registers, memory elements, etc., such as field-programmable gate arrays (FPGA), programmable logic arrays (PLA), and the like.

A computer-readable medium may include any tangible device that can store instructions to be executed by a suitable device, and as a result, the computer-readable medium having instructions stored in the tangible device comprises an article of manufacture including instructions which can be executed to create means for executing operations specified in the flowcharts or block diagrams. Examples of the computer-readable medium may include an electronic storage medium, a magnetic storage medium, an optical storage medium, an electromagnetic storage medium, a semiconductor storage medium, etc. Specific examples of the computer-readable medium may include a floppy (registered trademark) disk, a diskette, a hard disk, a random access memory (RAM), a read-only memory (ROM), an erasable programmable read-only memory (EPROM or Flash memory), an electrically erasable programmable read-only memory (EEPROM), a static random access memory (SRAM), a portable compact disc read-only memory (CD-ROM), a digital versatile disc (DVD), a Blu-ray (registered trademark) disc, a memory stick, an integrated circuit card, or the like.

The computer-readable instructions may include assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk (registered trademark), JAVA (registered trademark), C++ or the like, and conventional procedural programming languages, such as the "C" programming language or similar programming languages.

Computer-readable instructions may be provided to a processor of a general-purpose computer, special purpose computer, or other programmable data processing apparatus, or to programmable circuitry, locally or via a local area network (LAN), wide area network (WAN) such as the Internet, etc., so that the computer-readable instructions are executed to create means for performing operations specified in the flowcharts or block diagrams. Examples of the processor include a computer processor, a processing unit, a microprocessor, a digital signal processor, a controller, a microcontroller, and the like.

Figure 7:
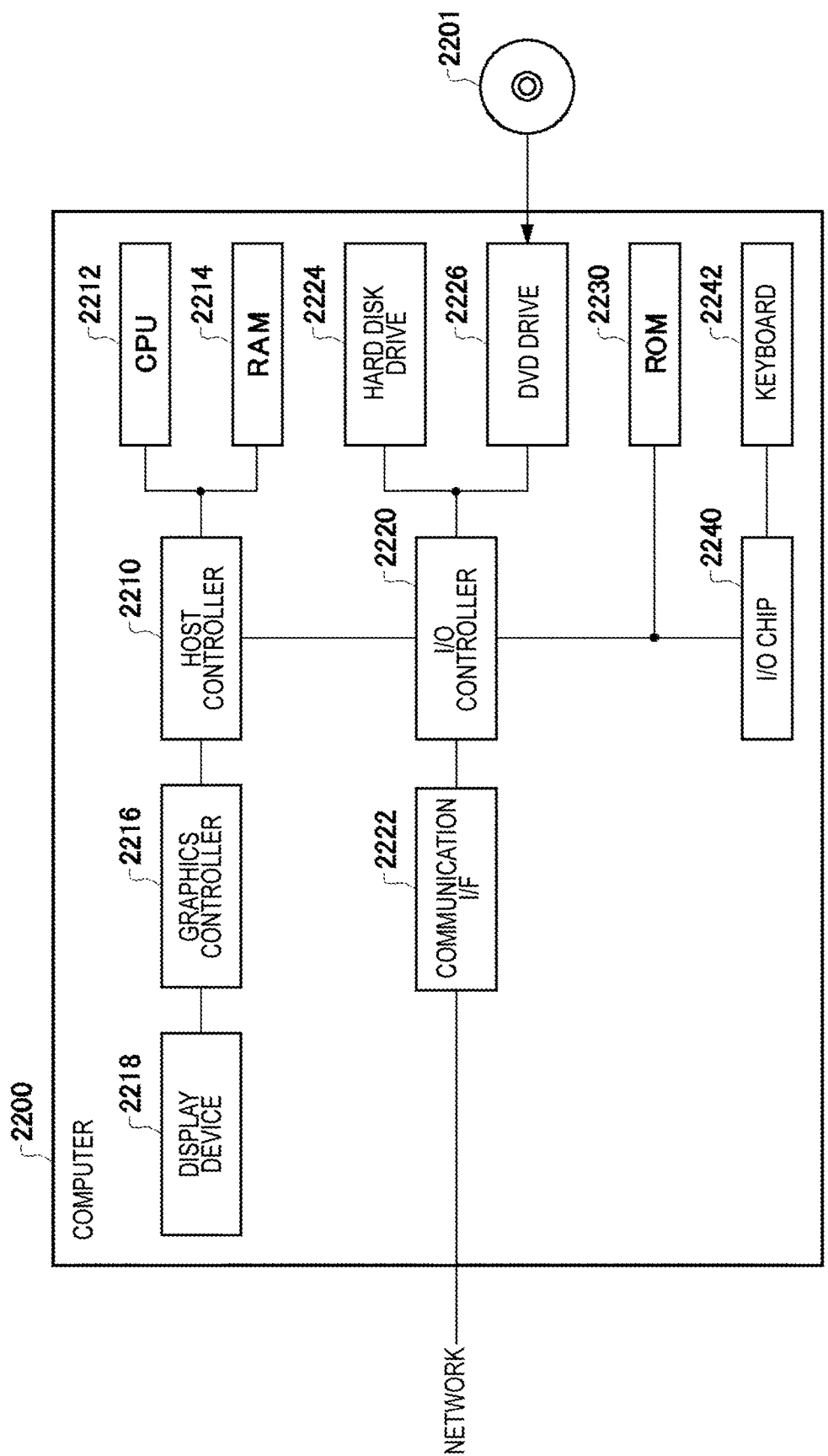
FIG. 7 shows an example of a computer 2200 in which a plurality of aspects of the present invention may be embodied entirely or partially.

FIG. 7 shows an example of a computer 2200 in which a plurality of aspects of the present invention may be embodied entirely or partially. A program that is installed in the computer 2200 can cause the computer 2200 to function as operations associated with apparatuses according to the embodiments of the present invention or one or more sections of the apparatuses, or can cause the computer 2200 to execute the operations or the one or more sections thereof, and/or can cause the computer 2200 to execute processes according to the embodiments of the present invention or steps of the processes. Such a program may be executed by a CPU 2212 to cause a computer 2200 to execute certain operations associated with some or all of the blocks of flowcharts and block diagrams described herein.

The computer 2200 according to the present embodiment includes the CPU 2212, a RAM 2214, a graphics controller 2216, and a display device 2218, which are interconnected by a host controller 2210. The computer 2200 also includes input/output units such as a communication interface 2222, a hard disk drive 2224, a DVD-ROM drive 2226, and an IC card drive, which are connected to the host controller 2210 via an input/output controller 2220. The computer also includes legacy input/output units such as a ROM 2230 and a keyboard 2242, which are connected to the input/output controller 2220 via an input/output chip 2240.

The CPU 2212 operates according to programs stored in the ROM 2230 and the RAM 2214, thereby controlling each unit. The graphics controller 2216 obtains image data generated by the CPU 2212 on a frame buffer or the like provided in the RAM 2214 or in the graphics controller 2216 itself, and causes the image data to be displayed on the display device 2218.

The communication interface 2222 communicates with other electronic devices via a network. The hard disk drive 2224 stores programs and data used by the CPU 2212 within the computer 2200. The DVD-ROM drive 2226 reads the programs or the data from a DVD-ROM 2201, and provides the hard disk drive 2224 with the programs or the data via the RAM 2214. The IC card drive reads the programs and the data from an IC card, and/or writes the programs and the data to the IC card.

The ROM 2230 stores therein a boot program or the like executed by the computer 2200 at the time of activation, and/or a program depending on the hardware of the computer 2200. The input/output chip 2240 may also connect various input/output units to the input/output controller 2220 via a parallel port, a serial port, a keyboard port, a mouse port, and the like.

A program is provided by the computer-readable medium such as the DVD-ROM 2201 or the IC card. The program is read from the computer-readable medium, installed in the hard disk drive 2224, the RAM 2214, or the ROM 2230, which is also an example of the computer-readable medium, and executed by the CPU 2212. The information processing written in these programs is read into the computer 2200, resulting in cooperation between a program and the above-mentioned various types of hardware resources. An apparatus or method may be constituted by realizing the operation or processing of information in accordance with the usage of the computer 2200.

For example, when a communication is executed between the computer 2200 and an external device, the CPU 2212 may execute a communication program loaded in the RAM 2214, and instruct the communication interface 2222 to process the communication based on the processing written in the communication program. The communication interface 2222, under control of the CPU 2212, reads transmission data stored on a transmission buffering region provided in a recording medium such as the RAM 2214, the hard disk drive 2224, the DVD-ROM 2201, or the IC card, and transmits the read transmission data to a network or writes reception data received from a network to a reception buffering region or the like provided on the recording medium.

In addition, the CPU 2212 may cause all or a necessary portion of a file or a database to be read into the RAM 2214, the file or the database having been stored in an external recording medium such as the hard disk drive 2224, the DVD-ROM drive 2226 (the DVD-ROM 2201), the IC card, etc., and execute various types of processing on the data on the RAM 2214. The CPU 2212 then writes back the processed data to the external recording medium.

Various types of information, such as various types of programs, data, tables, and databases, may be stored in the recording medium to undergo information processing. The CPU 2212 may execute various types of processing on the data read from the RAM 2214 to write back a result to the RAM 2214, the processing being described throughout the present disclosure, specified by instruction sequences of the programs, and including various types of operations, information processing, condition determinations, conditional branching, unconditional branching, information retrievals/replacements, or the like. In addition, the CPU 2212 may search for information in a file, a database, etc., in the recording medium. For example, when a plurality of entries, each having an attribute value of a first attribute associated with an attribute value of a second attribute, are stored in the recording medium, the CPU 2212 may search for an entry matching the condition whose attribute value of the first attribute is designated, from among the plurality of entries, and read the attribute value of the second attribute stored in the entry, thereby obtaining the attribute value of the second attribute associated with the first attribute satisfying the predetermined condition.

The above-described program or software modules may be stored in the computer-readable medium on the computer 2200 or near the computer 2200. In addition, a recording medium such as a hard disk or a RAM provided in a server system connected to a dedicated communication network or the Internet can be used as the computer-readable media, thereby providing the program to the computer 2200 via the network.

While the embodiments of the present invention have been described, the technical scope of the invention is not limited to the above-described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES 10 measurement system
20 measurement target
30 device under measurement
100 test apparatus
110 tester main body
120 test head
130 performance board
140 probe card
142 substrate
144 probe housing
146 probe needle
148 jig
150 prober
200 maintenance apparatus
210 input unit
220 acquisition unit
230 learning unit
240 calculation unit
250 determination unit
260 output unit
610 model generation unit
2200 computer
2201 DVD-ROM
2210 host controller
2212 CPU
2214 RAM
2216 graphics controller
2218 display device
2220 input/output controller 2222 Communication interface
2224 hard disk drive
2226 DVD-ROM drive
2230 ROM
2240 input/output chip
2242 keyboard

What is claimed is:

1. A maintenance apparatus comprising:
an acquisition unit configured to acquire a plurality of test results, for at least one jig, in a case where a plurality of devices under measurement, which are different from each other, are sequentially tested via the jig;
a calculation unit configured to calculate a variation in the plurality of test results, for the jig, by using the plurality of test results; and
a determination unit configured to determine maintenance timing of the jig based on the variation in the plurality of test results,
wherein the determination unit is configured to compare the variation in the plurality of test results with a variation in a plurality of test results obtained with the jig in a normal state to calculate a difference between the variation in the plurality of test results with a variation in a plurality of test results obtained with the jig in a normal state, and determine the maintenance timing based on the difference.

2. The maintenance apparatus according to claim 1, wherein the at least one jig is one of a plurality of jigs, wherein the acquisition unit is configured to acquire a corresponding plurality of test results for each of the plurality of jigs, wherein the calculation unit is configured to calculate a variation in the corresponding plurality of test results for each of the plurality of jigs, wherein the determination unit is configured to determine maintenance timing of the plurality of jigs based on the variation in the corresponding plurality of test results for at least one of the plurality of jigs, wherein the acquisition unit is further configured such that each corresponding plurality of test results is obtained by a corresponding one of the plurality of jigs sequentially testing a corresponding plurality of devices under measurement, wherein the plurality of devices under measurement are one corresponding plurality of devices under measurement corresponding to one of the plurality of jigs, wherein the variation in the normal state is an average of variations in the test results for the plurality of jigs in the normal state, wherein the determination unit uses the variation in the corresponding plurality of test results for each of the plurality of jigs and the average of variations in the test results for the plurality of jigs in the normal state to calculate the difference, and wherein the determination unit determines the maintenance timing of the plurality of Jigs based upon the difference.

3. The maintenance apparatus according to claim 2, wherein
the determination unit is configured to calculate the difference by machine learning.

4. The maintenance apparatus according to claim 3, wherein
the difference is a Mahalanobis distance.

5. The maintenance apparatus according to claim 4, further comprising:
a learning unit configured to learn a covariance matrix, which is used for calculating the Mahalanobis distance, by using the plurality of test results acquired in the normal state.

6. The maintenance apparatus according to claim 1, wherein the determination unit is configured to determine to maintain the jig when the difference exceeds a predetermined threshold value.

7. The maintenance apparatus according to claim 6, wherein
the predetermined threshold value is determined by machine learning.

8. The maintenance apparatus according to claim 1, wherein
the determination unit is configured to calculate the difference by machine learning.

9. The maintenance apparatus according to claim 8, further comprising:
a model generation unit configured to generate, by machine learning, a model for detecting a deviation with respect to the variation in the normal state based on the variation in the test results, wherein
the determination unit is configured to calculate the difference based on an output of the model.

10. The maintenance apparatus according to claim 1, wherein
the calculation unit is configured to analyze the plurality of test results in a predetermined period, while sequentially changing a start point of the period, and calculate the variation in the test results.

11. The maintenance apparatus according to claim 1, wherein
the calculation unit is configured to calculate a variation in failure rate in the plurality of test results.

12. The maintenance apparatus according to claim 11, wherein
the failure rate is a total failure rate indicating that at least one item in a plurality of test items has failed.

13. The maintenance apparatus according to claim 11, wherein
the failure rate is a partial failure rate indicating that a specific item in a plurality of test items has failed.

14. The maintenance apparatus according to claim 1, wherein
the determination unit is configured to determine a cleaning time of the jig as the maintenance timing.

15. The maintenance apparatus according to claim 14, wherein
the determination unit is configured to further determine a cleaning method for the jig.

16. The maintenance apparatus according to claim 15, wherein
the determination unit is configured to determine the cleaning method for the jig based on the variation in the test results for each item in a plurality of test items.

17. A maintenance method comprising:
acquiring a plurality of test results, for at least one jig, in a case where a plurality of devices under measurement, which are different from each other, are sequentially tested via the at least one jig;
calculating a variation in the plurality of test results, for the jig, by using the plurality of test results; and
determining maintenance timing of the jig based on the variation in the plurality of test results,
wherein determining maintenance timing includes comparing the variation in the plurality of test results with a variation in a plurality of test results obtained with the jig in a normal state to calculate a difference between the variation in the plurality of test results with a variation in a plurality of test results obtained with the jig in a normal state, and determining the maintenance timing based on the difference.

18. A non-transitory, computer-readable recording medium having recorded thereon a maintenance program that is executed by a computer and causes the computer to function as:
- an acquisition unit configured to acquire a plurality of test results, for at least one jig, in a case where a plurality of devices under measurement, which are different from each other, are sequentially tested via the at least one jig;
- a calculation unit configured to calculate a variation in the plurality of test results, for the jig, by using the plurality of test results; and
- a determination unit configured to determine maintenance timing of the jig based on the variation in the plurality of test results,
- wherein the determination unit is configured to compare the variation in the plurality of test results with a variation in a plurality of test results obtained with the jig in a normal state to calculate a difference between the variation in the plurality of test results with a variation in a plurality of test results obtained with the jig in a normal state, and determine the maintenance timing based on the difference.

\* \* \* \* \*